United States Patent
Park et al.

(10) Patent No.: US 10,310,022 B2
(45) Date of Patent: Jun. 4, 2019

(54) BATTERY STATE ESTIMATION APPARATUS AND METHOD

(71) Applicant: Samsung Electronics Co., Ltd., Suwon-si (KR)

(72) Inventors: SangDo Park, Seoul (KR); Kaeweon You, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 100 days.

(21) Appl. No.: 15/488,588

(22) Filed: Apr. 17, 2017

(65) Prior Publication Data
US 2018/0095140 A1  Apr. 5, 2018

(30) Foreign Application Priority Data
Oct. 5, 2016 (KR) .................. 10-2016-0128339

(51) Int. Cl.
*G06F 19/00* (2018.01)
*G01R 31/378* (2019.01)
*G01R 31/392* (2019.01)
*G01R 31/367* (2019.01)

(52) U.S. Cl.
CPC ......... *G01R 31/378* (2019.01); *G01R 31/367* (2019.01); *G01R 31/392* (2019.01)

(58) Field of Classification Search
CPC ............. G01R 31/3651; B60L 11/1861; B60L 2240/547; B60L 2240/549
USPC .................... 702/63, 64, 182–185
See application file for complete search history.

(56) References Cited

U.S. PATENT DOCUMENTS

| | | | |
|---|---|---|---|
| 5,596,260 | A | 1/1997 | Moravec et al. |
| 7,576,517 | B1 | 8/2009 | Cotton et al. |
| 2014/0266059 | A1 | 9/2014 | Li et al. |
| 2016/0202324 | A1* | 7/2016 | Biletska ............ G01R 31/3651 702/63 |

FOREIGN PATENT DOCUMENTS

| | | |
|---|---|---|
| JP | 2008-151526 A | 7/2008 |
| JP | 4134877 B2 | 8/2008 |
| JP | 2014-13245 A | 1/2014 |
| JP | 2014-77785 A | 5/2014 |
| JP | 2015-220211 A | 12/2015 |
| KR | 10-0727365 B1 | 6/2007 |

* cited by examiner

*Primary Examiner* — Edward Raymond
(74) *Attorney, Agent, or Firm* — NSIP Law

(57) ABSTRACT

Provided is a battery state estimation apparatus and method that determine a validity of a battery model, which is dependent on a parameter, based on state information of a battery that is estimated from battery information of the battery, transmit an update request for the battery model to an external battery model provider in response to a result of the determining indicating that the battery model is invalid, receive another parameter in response to the update request, and update the battery model based on the other parameter.

28 Claims, 12 Drawing Sheets

FIG. 10B

| Ver. | Parameters | Estimation range |
|---|---|---|
| 2.0 | W11=0.011, W12=0.232, W13=... | 97~100 |
| 2.1 | W11=0.001, W12=0.222, ... | 90~98 |
| 2.2 | W11=0.031, W12=0.129, ... | 87~92 |
| 2.3 | .... | 83~89 |
| 2.4 | .... | 80~85 |

BATTERY STATE ESTIMATION APPARATUS AND METHOD

CROSS-REFERENCE TO RELATED APPLICATION

This application claims the benefit under 35 USC § 119(a) of Korean Patent Application No. 10-2016-0128339 filed on Oct. 5, 2016, in the Korean Intellectual Property Office, the entire disclosure of which is incorporated herein by reference for all purposes.

BACKGROUND

1. Field

The following description relates to technologies that include battery state estimation.

2. Description of Related Art

A number of electronic devices include batteries, such as primary or as secondary batteries that are charged repetitively during operations of the devices. As the number of times a battery is discharged and charged increases, the capacity of the battery gradually decreases. Accordingly, as each charge cycle repeats, the battery life of the underlying electronic device decreases. As the battery life decreases, an initial battery capacity may no longer be guaranteed after many charge and discharge cycles. With such continuous decreases in battery capacities, power, operation time, and stability of corresponding electronic devices may be compromised. Thus, the battery may need to be replaced with a new one.

For example, to determine an expected time for battery replacement, a state of health (SoH) of the battery may be estimated.

SUMMARY

This Summary is provided to introduce a selection of concepts in a simplified form that are further described below in the Detailed Description. This Summary is not intended to identify key features or essential features of the claimed subject matter, nor is this Summary intended to be used as an aid in determining the scope of the claimed subject matter.

In one general aspect, a processor implemented method to estimate a state of a battery includes determining a validity of a battery model, which is dependent on a parameter, based on state information of the battery that is estimated from battery information of the battery, transmitting an update request for the battery model to an external battery model provider in response to a result of the determining indicating that the battery model is invalid, receiving another parameter in response to the update request, and updating the battery model based on the other parameter.

The method may further include estimating the state information of the battery using the updated battery model and the battery information.

The determining may include estimating the state information of the battery from the battery information using the battery model, determining whether the estimated state information of the battery is outside of an estimation range of the battery model, determining that the battery model is valid in response to the estimated state information of the battery being within the estimation range, and determining that the battery model is invalid in response to the estimated state information being outside of the estimation range.

The determining of whether the estimated state information of the battery is outside of the estimation range may include determining that the estimated state information of the battery is outside of the estimation range in response to the estimated state information of the battery being less than a predetermined minimum level of state information set to be accurately estimated by the battery model.

The transmitting may include transmitting, to a battery state estimation server that generates battery state models based on different parameters, a signal to request at least one parameter having a range overlapping at least a portion of an estimation range of the parameter that the battery model is dependent on.

The determining may include determining that the parameter that the battery model is dependent on is invalid in response to the estimated state information of the battery being outside of an estimation range of the battery model, and the transmitting may include transmitting, to a battery state estimation server that generates battery state models based on different parameters, a signal to request at least one parameter trained to estimate state information less than or equal to a predetermined minimum level of the estimation range of the parameter that the battery model is dependent on in response to the estimated state information of the battery being less than or equal to the predetermined minimum level.

The receiving may include receiving, from the battery state estimation server, one or more parameters trained to a different predetermined minimum level, of a different estimation range predetermined for accurate estimation, based on all or a select portion of reference data collected by the battery state estimation server up to a point in time at which the update request is received.

The method may further include searching for a parameter corresponding to a sensed change in the battery, from among parameters stored in a memory, updating, when the searched for parameter is found, the battery model based on the found parameter, performing, when the searched for parameter is not found, the transmitting, the receiving of the other parameter, and the updating of the battery model based on the other parameter, and estimating state information of the battery with the sensed change based on the updated battery model.

The determining may further include searching for a parameter corresponding to a changed battery, among parameters stored in a memory, in response to a change of the battery being sensed, and the transmitting may further include transmitting a signal to request the parameter corresponding to the changed battery in response to the parameter corresponding to the changed battery being not found.

The method may further include continuing an estimating of the state information of the battery for continued changes in the battery information based on the parameter that the battery model is dependent on, until the result of the determining indicates that that the estimated state information is invalid.

The he battery model may be a battery model neural network and the parameter may be a representation of specially trained connection weights within the battery model neural network trained for estimating a battery state for a first state information estimation range, and the updating of the battery model may include applying connection weights represented by the other parameter to a neural network structure to generate another specially trained battery model neural network trained for estimating a battery state for a different second state information estimation range, where the generated other specially trained battery model neural network may be the updated battery model.

The battery model may be a battery model neural network and the parameter that the battery model is dependent on is a trained connection weighting matrix, and the other parameter may be a different trained connection weighting matrix.

The parameter and the other parameter may be respectively trained parameters for different battery state estimation ranges.

In one general aspect, there is provided a non-transitory computer-readable medium storing instructions, that when executed by a processor, cause the processor to perform one or more or all of the processes described herein.

In one general aspect, an apparatus to estimate a state of a battery may include a communicator to communicate with an external battery model provider, a memory to store a battery state estimation model that is dependent on a parameter, and a processor configured to determine a validity of the battery state estimation model based on state information of the battery that is estimated from battery information of the battery, control the communicator to transmit an update request for the battery state estimation model to the external battery model provider in response to a result of the determining indicating that the battery state estimation model is invalid, and update the battery state estimation model based on another parameter received in response to the update request.

The apparatus may further include the battery.

The processor may be configured to estimate the state information of the battery from the battery information using the battery state estimation model, determine whether the estimated state information of the battery is outside of an estimation range of the battery state estimation model, determine that the battery state estimation model is valid in response to the estimated state information of the battery being within the estimation range, and determine that the battery state estimation model is invalid in response to the estimated state information being outside of the estimation range.

The processor may be configured to determine that the estimated state information of the battery is outside of the estimation range in response to the estimated state information of the battery being less than a predetermined minimum level of state information set to be accurately estimated by the battery state estimation model.

The processor may be configured to control the communicator to transmit, to a battery state estimation server that generates battery state estimation models based on different parameters, a signal to request at least one parameter having a range overlapping at least a portion of an estimation range of the parameter that the battery state estimation model is dependent on.

The processor may be configured to determine that the parameter that the battery state estimation model is dependent on is invalid in response to the estimated state information of the battery being outside of an estimation range of the battery state estimation model, and control the communicator to transmit, to a battery state estimation server that generates battery state estimation models based on different parameters, a signal to request at least one parameter trained to estimate state information less than or equal to a predetermined minimum level of the estimation range of the parameter that the battery state estimation model is dependent on in response to the estimated state information of the battery being less than or equal to the predetermined minimum level.

The parameter and the other parameter may be respectively trained parameters for different battery state estimation ranges.

In one general aspect, an apparatus to estimate a state of a battery may include a processor configured to determine a validity of a battery state estimation model neural network, which is dependent on first trained connection weighting information, based on state information of a battery that is estimated from battery information of the battery, control a transmitting of an update request for the battery state estimation model neural network to an external battery model provider in response to the determining indicating that the battery state estimation model neural network is invalid, and update the battery state estimation model neural network based on second different trained connection weighting information received in response to the update request.

The first trained connection weighting information may be trained connection weighting information for a battery state estimation range different from a battery state estimation range for which the second trained connection weighting information is trained.

Other features and aspects will be apparent from the following detailed description, the drawings, and the claims.

BRIEF DESCRIPTION OF THE DRAWINGS

FIGS. 10A and 10B respectively illustrate an example of a battery model and parameters applied to the battery model in accordance with one or more embodiments.

Figure 1:
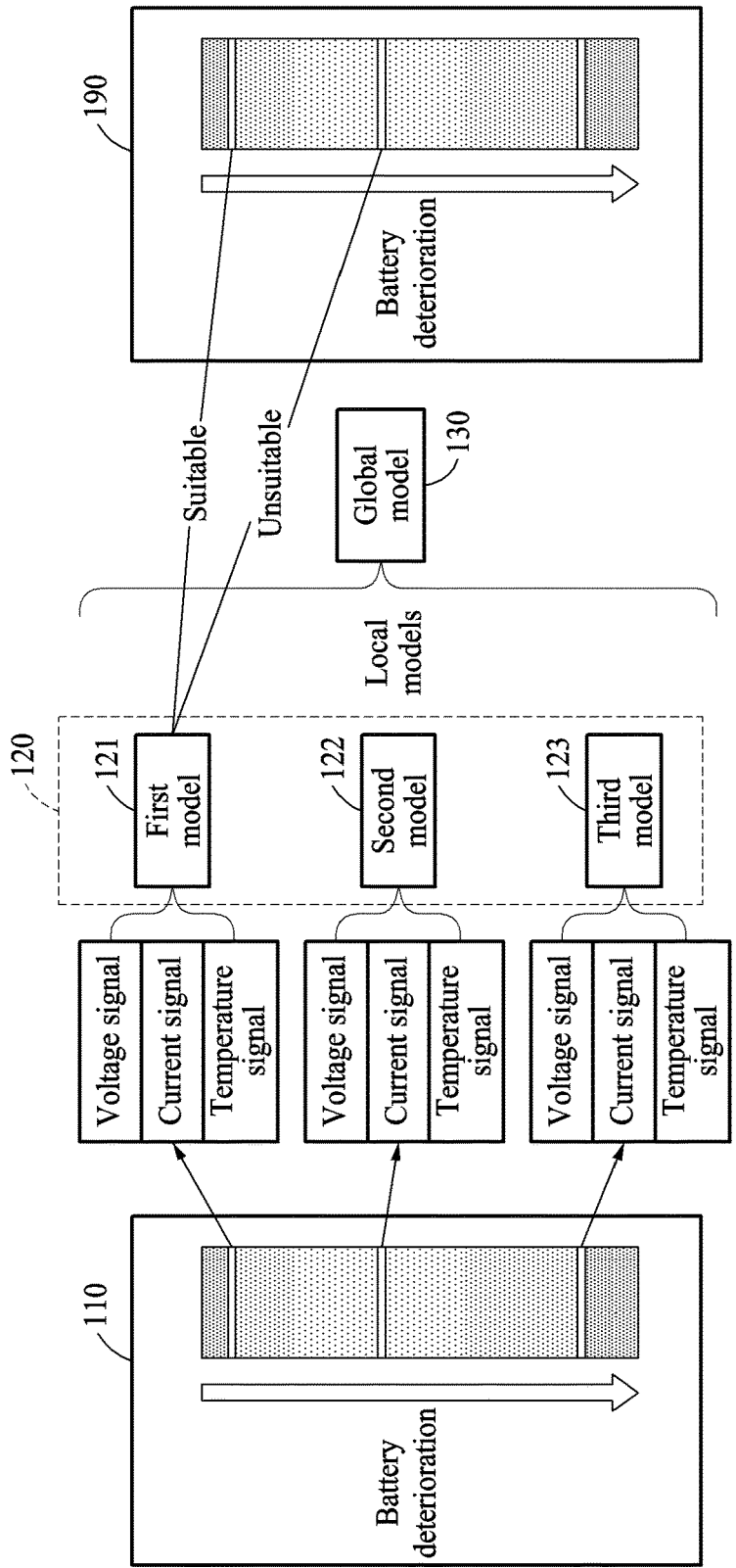
FIG. 1 is a diagram illustrating an example of a training of a battery model and use of the battery model to estimate a state of a battery in accordance with one or more embodiments.

Throughout the drawings and the detailed description, unless otherwise described or provided, the same drawing reference numerals will be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Various alterations and modifications may be made to the examples. Here, the examples are not construed as limited to the disclosure and should be understood to include all changes, equivalents, and replacements within the idea and the technical scope of the disclosure.

The terminology used herein is for the purpose of describing particular examples only and is not to be limiting of the examples. As used herein, the singular forms "a", "an", and "the" are intended to include the plural forms as well, unless the context clearly indicates otherwise. It will be further understood that the terms "include/comprise" and/or "have" when used in this specification, specify the presence of stated features, integers, operations, elements, components, and/or combinations thereof, but do not preclude the presence or addition of one or more other features, numbers, operations, elements, components, and/or groups thereof.

Unless otherwise defined, all terms including technical and scientific terms used herein have the same meaning as commonly understood by one of ordinary skill in the art to which this disclosure pertains consistent with and after an understanding of the present disclosure. It will be further understood that terms, such as those defined in commonly-used dictionaries, should be interpreted as having a meaning that is consistent with their meaning in the context of the relevant art and the present disclosure and will not be interpreted in an idealized or overly formal sense unless expressly so defined herein.

When describing the examples with reference to the accompanying drawings, like reference numerals refer to like constituent elements and a repeated description related thereto will be omitted.

FIG. 1 is a diagram illustrating an example of a training of a battery model and use of the battery model to estimate a state of a battery in accordance with one or more embodiments.

Technology to estimate a state of a battery is, for example, as follows. Computational analysis based technology mathematically expresses and interprets a chemical reaction of a battery to estimate a state of the battery using processor or processing hardware. For example, the computational analysis based technology mathematically expresses the chemical reaction of the battery, and estimates a life, a state of health (SoH), a state of charge (SoC), and an abnormal state of the battery based on states of materials constituting the battery. However, it is difficult to mathematically express an exact internal state of the battery in reality. Thus, to estimate the state of the battery, the computational analysis based technology applies various approximation schemes. An error may occur when estimating the state of the battery depending on the approximation scheme.

Statistics based technology estimates a state of a battery based on statistical values. The statistics based technology was developed based on computer science or statistics using processor or processing hardware. The statistics based technology estimates the state of the battery based on information observable from an outside of the battery although an exact internal state of the battery is not known. For example, the statistics based technology estimates the state of the battery based on battery information related to temperature, voltage, and current of the battery and a lookup table. However, to estimate the state of a particular battery the statistics based technology needs all reference data, such as all of reference data 110 of FIG. 1, of the particular battery prepared in advance, and thus a relatively long development time is required until full reference data related to the particular battery is collected. In addition, still further, each time a new battery is manufactured using a new material or configuration, for example, the same long reference data collection period is required. In a case in which insufficient reference data is provided, the statistics based technology may provide a low accuracy of battery state estimation. The full reference data is obtained by collecting a correlation between information associated with the battery and a state, for example, a life, of the battery from a point in time at which the battery is manufactured to an end of life of the battery. Thus, for example, when insufficient reference data is collected from the point in time at which the battery is manufactured to a predetermined point in time before the end of life of the battery, there are technological problems in accurately estimating the state of the battery.

Herein, battery information refers to information that may be collected from a battery, and includes, as non-limiting examples, a voltage signal, a current signal, and a temperature signal measured from the battery.

In addition, herein, state information of a battery refers to information indicating a state of the battery, and includes, for example, an SoH, an SoC, and/or a residual available travel distance of the battery. However, although the SoH of the battery is described herein as an example of the state information of the battery, embodiments are not limited thereto. The embodiments may also be applied to other state information of the battery.

Herein, reference data, such as the illustrated reference data 110 of FIG. 1, refers to data indicating state information which is a criterion for estimating a state of a battery, and data indicating that a predetermined battery has predetermined state information for provided battery information. The reference data is obtained by an experiment and/or simulation, such as by an example battery state estimation server or by a battery state estimation apparatus that may also be a server. For example, the training reference data includes a set of pairs of training inputs and corresponding training outputs. A training input is battery information collected of or from the predetermined battery, and while a training output may be an actual life of the predetermined battery corresponding to the training input, or a battery life extracted from stored battery data for the predetermined battery corresponding to the training input. For example, the actual life may represent the life of the predetermined battery measured directly from the battery using electrochemical impedance spectroscopy (EIS). EIS measures an internal resistance of the battery by applying a small amount of currents to the battery. The reference data may represent data obtained by extracting a correlation between state information and battery information. Thus, a battery model may be trained by, for example, iteratively adjusting a specialized configuration and intuitive operation of the battery model until the battery model sufficiently accurately outputs, e.g., to predetermined accuracies or confidence levels, the example training output for corresponding given example training input.

Thus, herein, the battery model refers to a model specifically configured to estimate state information of a battery. As noted, the battery model may be a model configured to output state information corresponding to predetermined battery information. For example, the battery model is configured to output a life of the battery based on a voltage signal, a current signal, and/or a temperature signal of the battery, for example. The battery model may have been configured through training using the predetermined battery information to always output a same life of the battery under specific input conditions, though embodiments are not limited thereto. The battery model may be a machine learning (ML) model, and may be trained to compute output based on input, based on trained configurations and operations of the battery model generated through such ML model previous computed training outputs from training inputs based on the aforementioned training reference data, such as the reference data 110 of FIG. 1. Further, depending on embodiment, the ML battery model may be a neural network, a hidden Markov model, a Beyesian network, a support vector machine (SVM), a decision tree (DT), and/or a k-NN (nearest neighbors algorithm), as only examples.

As shown in FIG. 1, a battery state estimation apparatus may estimate state information of a battery, e.g., the battery having an actual battery state 190, using a plurality of battery models that have been trained based on reference data, e.g., reference data 110. The plurality of battery models are models trained with respect to different estimation ranges, or trained to have respective predetermined levels of accuracy or confidence for the different estimation ranges. For example, a first model 121 may be a battery model that was trained based on reference data 110 collected after an initial release or manufacture of the predetermined battery until an initial period after that release time. A second model 122 may be a battery model that was trained based on reference data 110 collected after the initial release or about the initial period until a middle point in time. A third model 123 may be a battery model that was trained based on reference data 110 fully collected or after the middle point in time. The plurality of battery models may have the same type of ML structures, with respective parameters of the same type ML structure being different from each other. Alternatively, the models may have different structures with different corresponding parameters. In an example, the plurality of battery models may be configured using neural networks and have the same number of layers and the same number of nodes, with different respective parameters representing different collections of specially trained connection weights between nodes of the corresponding different neural networks. For example, a parameter for a neural network battery model may be stored or transmitted as a matrix, with elements of the matrix representing the different connection weights between nodes of the specialized neural network battery model.

To obtain the reference data 110, a battery manufacturer or a battery state estimation server or system, or battery estimation apparatus that may act a server, collects reference data based on experiment data obtained from a battery degradation experiment after an initial production of the predetermined battery. A predetermined time is required to collect the experiment data related to the battery. Since a few years may be required to obtain full reference data 110, the battery state estimation server, for example, may sequentially generate local models 120, as the corresponding reference data become available, with each reflecting characteristics of a portion, e.g., correspondingly different portions, of life periods of the entire life of the predetermined battery based on the reference data collected until a corresponding point in time corresponding to that portion of life periods.

For example, the battery state estimation server generates an initial model, for example, the first model 121, based on reference data 110 collected until a first point in time, a middle model, for example, the second model 122, based on reference data 110 collected until a second point in time, and a final model, for example, the third model 123, based on reference data 110 collected until a third point in time. The battery state estimation apparatus may receive one or more of the battery models and/or corresponding parameters from the battery state estimation server, and estimates state information of a battery using the different corresponding battery models as appropriate.

The battery state estimation server may train a battery model based on reference data 110 collected until a predetermined point in time, for example, training the battery models sequentially in an order of the first model 121, the second model 122, and the third model 123. Although FIG. 1 illustrates three battery models, the number of the battery models is not limited thereto. N battery models may be provided, N being an integer greater than or equal to "1". Each time reference data 110 may be collected at a predetermined interval, the battery state estimation server generates a battery model corresponding to the reference data collected up until then. However, embodiments are not limited thereto. The battery state estimation server may generate a battery model at the time of the request for the battery model, for a select estimation range, from an external device, for example, an example battery state estimation apparatus that is remote from the battery state estimation server, such as in a battery state estimation system that includes one or more of the battery state estimation servers and one or more battery state estimation apparatuses.

As noted above, the battery state estimation apparatus may also implement such battery model generation, as well as application of the generated battery models for battery state estimation and/or server provision of the generated battery models, as described herein, to another battery state estimation apparatus. Accordingly, discussions herein with respect to the operations of the battery state estimation server are also applicable to the battery state estimation apparatus, and discussions with respect to the battery state estimation apparatus are also applicable to the battery state estimation server. In an example, a battery state estimation server may not perform the generation of the battery models, but only receive and store generated battery models from another battery state estimation server that implements the battery model generation operations discussed herein, and thus merely receive generated battery models as they are generated or made available and transmit/forward them to the battery state estimation apparatus as requested or otherwise discussed herein. Likewise, a battery state estimation apparatus that requests, receives, and uses received generated battery models may forward the received battery models to other another battery state estimation apparatus upon request or as otherwise discussed herein.

As demonstrated in FIG. 1, the first model 121 is a battery model trained based on reference data 110 collected in an initial period after an initial release or manufacture time of a new predetermined battery, and an estimation range of the first model 121 covers state information of the predetermined battery indicated by the reference data 110 collected until an initial point in time, for example, the first point in time. For example, as shown in FIG. 1, the first model 121 may be suitable for estimating state information of a battery until the initial point in time after the battery operates. However, a middle point in time, for example, the second point in time is outside of the estimation range of the first model 121, and thus an inaccurate result may be provided if the first model 121 is used to estimate a state of a battery at the second point in time. For example, in a case in which an actual battery state 190 for a battery of the battery state estimation apparatus is outside of an estimation range of a currently selected battery model of the battery state estimation apparatus, the battery state estimation apparatus may not estimate accurate state information using the currently selected battery model, and thus the battery estimation apparatus may request an update of the battery model from the battery state estimation server. Thus, the second model 122 may be provided by the battery state estimation server to the battery state estimation apparatus in response to the request.

Thus, after or after initiating the generating of the first model 121, the battery state estimation server may sequentially generate or initiate the generating of another model and still another model, for example, the second model 122 and the third model 123, based on the reference data 110 until the reference data 110 is fully collected and all the local models 120 have been generated. In response to the full reference data 110 being collected, the battery state estimation server generates a global model 130 that reflects overall characteristics of the corresponding battery. The local models 120 may require relatively short times for training and have relatively low model complexities, but may have predetermined sufficiently high accuracies or confidences for relatively narrow estimation ranges, e.g., compared to a predetermined sufficiently high accuracy or confidence available estimation range of the global model 130. The global model 130 may require a relatively long time for training and a relatively high model complexity, but has a relatively wide estimation range compared to the estimation ranges of the local models 120. Here, the estimation ranges of the local models 120 may immediately follow each other or they may partially overlap, for example. In addition, while an overall range represented by all the estimation ranges of the local models 120 may cover at least the estimation range of the global model 130, the overall range may be less than, equal, to or greater than the entire estimation range of the global model 130, and there may also be gaps between estimation ranges of the local models 120.

Hereinafter, a configuration of a battery state estimation apparatus appropriately receiving and updating one or more of such generated battery models, such as the local models 120 generated by the battery state estimation server in FIG. 1 based on different collection levels of reference data 110 will be described in greater detail with respect to FIG. 2. Here, it is noted that the battery state estimation server may also provide, e.g., upon request or upon completion, the global model 130 to the battery state estimation apparatus.

Figure 2:
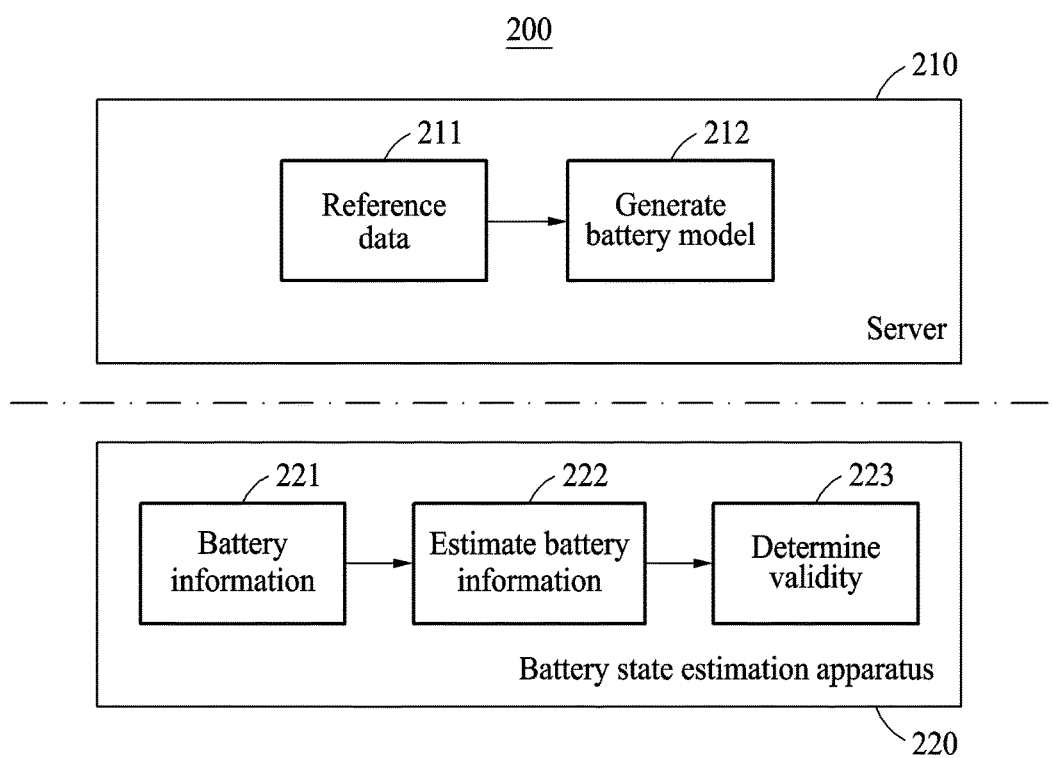
FIG. 2 illustrates an example of a configuration of a battery state estimation system in accordance with one or more embodiments.

FIG. 2 illustrates an example of a configuration of a battery state estimation system in accordance with one or more embodiments.

Referring to FIG. 2, an operation of a battery state estimation system 200 is divided into an operation of a battery state estimation server 210 and an operation of a battery state estimation apparatus 220.

In operation 212, the battery state estimation server 210 generates a battery model based on reference data 211. The battery state estimation server 210 receives or is input with the reference data 211 obtained from an experiment or simulation on a battery. Further, the battery state estimation server 210 may have a strong processing capability, and thus may generate the battery model from the reference data 211 at a fast processing speed.

In operation 222, the battery state estimation apparatus 220 estimates state information of a battery of the battery state estimation apparatus 220 from battery information 221 of the battery using a battery model. In operation 223, the battery state estimation apparatus 220 determines a validity of a current battery model based on the estimated state information.

As shown in FIG. 2, while the battery state estimation server 210 performs generation of a battery model using a great operation time and power, the battery state estimation apparatus 220 may simply receive the trained battery model or corresponding parameter from the battery state estimation server 210 and utilizes the new or updated battery model. Thus, required performance for the battery state estimation apparatus 220 may not be relatively great, and thus a production cost of the battery state estimation apparatus 220 may be low compared to the battery state estimation server 210.

Figure 3:
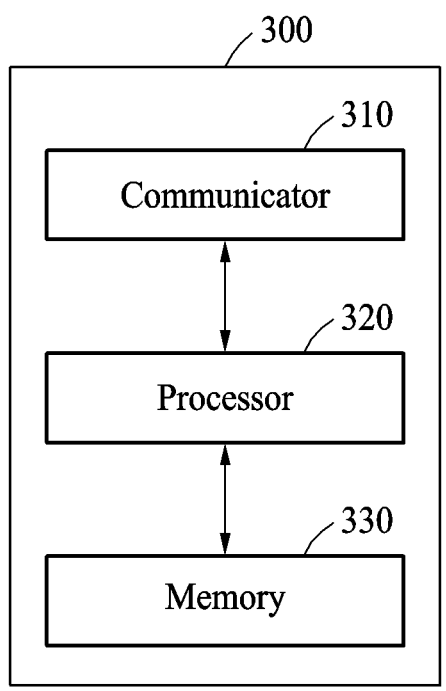
FIG. 3 illustrates an example of a configuration of a battery state estimation apparatus in accordance with one or more embodiments.

FIG. 3 illustrates an example of a configuration of a battery state estimation apparatus in accordance with one or more embodiments.

Referring to FIG. 3, a battery state estimation apparatus 300 includes a communicator 310, a processor 320, and a memory 330, for example.

The communicator 310 communicates with a battery state estimation server, such as the battery state estimation server discussed above with respect to FIGS. 1 and 2. For example, the communicator 310 communicates with the battery state estimation server in a wired or wireless manner. The communicator 310 transmits an update request to the battery state estimation server. The battery state estimation server may receive the request and, in response, transmit a parameter for another battery model, or for updating the current battery model of the battery state estimation apparatus, to the communicator 310. The communicator 310 may then receive the parameter corresponding to the update request from the battery state estimation server. Further, the communicator 310 may communicate with the battery state estimation server using various wireless mobile networks, for example, 3G, 4G, 5G, and Wi-Fi, or using cable connection, as only examples. The cable connection may be configured to perform data communication and to supply power through a charger. The parameter may include information, or may be transmitted along with such information, related to an estimation range in a case in which the parameter configures a battery model, or the estimation range is mapped to the received parameter. In an example, the communicator 310 receives the estimation range along with the parameter from the battery state estimation server through a network protocol. The estimation range may include or represent a threshold of a minimum level of estimable state information and a threshold of a maximum level of the state information with sufficient predetermined accuracy or confidence.

Hereinafter, the parameter refers to information that configures a battery model, e.g., information to be used to configure a specially trained battery model, as discussed above with respect to FIG. 1. For example, in a case in which the battery model is a neural network, the parameter may define the connection weights of connections that connect nodes of the neural network. The battery state estimation apparatus 300 updates the parameter of the battery model as necessary. For example, the battery state estimation apparatus 300 may change from a previous applied parameter of a current battery model to now use the received parameter to update the current battery model. Alternatively, such updating of the current battery model may also be considered as a generation of a new specially trained neural network based on the received parameter, with the newly generated neural network being the updated current battery model.

The update request may be a signal to request such a parameter to be used to update the battery model from the battery state estimation server. For example, the update request may be a signal to request a parameter for a battery model corresponding to a range overlapping at least a portion of an estimation range of a current battery model that is based on a currently applied parameter.

Herein, the estimation range is a range of state information to be estimated, e.g., by the processor 320, using a parameter defining a trained battery model. In a case in which the state information is an SoH, the SoH of a newly manufactured battery is indicated as 100%, and the battery may be released, released from manufacture, or firstly used at a point in time at which reference data may have only so far been collected with respect to a range of the SoH from 100% to 90%. Thus, the corresponding generated battery model, defined by corresponding parameter, based on this limited reference data would have an estimation range of the SoH from 100%, for example, as the maximum level, to 90%, for example, as the minimum level, and may not guarantee accuracy at a sufficiently high predetermined level with respect to a range less than or greater than the estimation range. In a case in which more reference data had been collected, for example, additionally collected to a range from 90% to 80%, another parameter defining another battery model generated based on the newly collected reference data would represent a range of the SoH from 100% to 80% as the estimation range for the other battery model. The other generated battery model may alternatively be configured to have a range of the SoH from 91% to 80% as the estimation range.

The processor 320 may perform operations to estimate the state information of the battery. For example, the processor 320 may determine a validity of a current battery model based on state information of a battery estimated from battery information, transmit an update request for an updated battery model to the battery state estimation server using the communicator 310 in response to a determination that the current battery model is invalid, and update the current battery model based on a received parameter corresponding to the update request, e.g., with the parameter being received from the battery state estimation server.

The memory 330 may store the current and the updated battery model and/or corresponding parameter. In an example, after updating of the current battery model, the battery state estimation apparatus 300 may delete the current battery model and/or parameter from the memory 330 and only store the updated current battery model and/or parameter. The memory 330 stores at least one battery model, for example, separately stores and manages battery models having different estimation ranges. The battery models having different estimation ranges may be identified according to different versions of their parameters. Hereinafter, a version refers to information or an indication to be used to distinguish parameters generated based on reference data collected by such a battery state estimation server at a plurality of different points in time. The memory 330 may manage the battery models by type, and stores various parameters corresponding to different estimation ranges by mapping the parameters to battery models of respective types. A type of a battery model indicates one of the aforementioned ML structures. In addition, while entire battery models may be stored, alternatively only the corresponding parameters are stored and a corresponding specially trained model generated by applying a select parameter to an existing model structure during estimation of a corresponding estimation range. In another example, the select parameter may further include addition structural formation, such a hyper-parameter information for a neural network battery model example to define the configuration of layers and nodes in the neural network in addition to the connection weights between nodes.

In an example, the battery state estimation apparatus 300 may be a battery management system (BMS) configured to control a battery pack including multiple batteries. An apparatus including a battery includes, for example, an electric vehicle, a plug-in hybrid-electric vehicle (PHEV), and a hybrid electric vehicle (HEV), as only examples. In an example, the battery state estimation apparatus 300 is the vehicle, and includes the BMS and the battery pack, as well as a sensing system to measure voltage, current, and/or temperature information of the battery pack, and a user interface with a display.

Although a product release timing of a battery or corresponding electronic device may occur in a situation where an amount of initial reference data has insufficiently been generated for an accurate battery state estimation using a full or global battery model or for estimation ranges beyond an initial estimation range corresponding to an initial battery model or parameter originally included with a battery state estimation apparatus 300 configured to estimate the battery state of the battery, the battery state estimation apparatus according to one or more embodiments may update a parameter of a battery model continuously, thereby maintaining an accuracy of battery state estimation. Thus, a battery state estimation server and/or battery state estimation apparatus according to one or more embodiments reduces a time to be used for commercialization.

The battery state estimation apparatus 300 may obtains a recent parameter from the battery state estimation server that is remotely connected. The battery state estimation server may have generated multiple such parameters for multiple estimation ranges with respect to a now deteriorated battery based on respective trainings by securing reference data which may have been unavailable at the time of product release of the battery state estimation apparatus 300, for example. As noted above, an estimation range to be supported by a parameter of a battery model trained based on reference data collected until a predetermined point in time is determined based on the then available amount of the reference data. In response to a determination that a deterioration level of the battery of the battery state estimation apparatus 300 is outside of an estimation range of a currently selected battery model, the battery state estimation apparatus 300 requests a recent parameter on-the-fly, e.g., in real time, from the battery state estimation server to estimate a state of the battery.

In a case in which the battery state estimation apparatus 300 is not connected to the battery state estimation server, the battery state estimation apparatus 300 may not use an existing parameter. Thus, the battery state estimation apparatus 300 may temporarily suspend an operation of estimating state information of the battery until the battery state estimation apparatus 300 is connected to the battery state estimation server. Further, the battery state estimation apparatus 300 provides information related to the currently selected battery model and the parameter to a user through a visual or auditory user interface (UI) of the battery state estimation apparatus 300 or through a local bus connected to such a UI of an underlying electronic device, vehicle, or drone that includes the battery state estimation apparatus 300.

The battery state estimation apparatus 300 may generate a battery model to estimate state information of a battery in a least amount of time after release of the battery state estimation apparatus 300, for example, compared to previous requirements of a full or global model, based on full reference data, being necessary. Further, as a time elapses, the battery state estimation apparatus 300 may receive a parameter having a higher accuracy continuously from the battery state estimation server. In addition, the accuracy of battery state estimation may improve using driving history data of an electric vehicle (EV) as the reference data. For example, where the battery model is a neural network, the neural network may be a deep neural network with many layers, including an input layer to receive the driving history data and the information of the battery, or separate respective input layers for the driving history data and the information of the battery, for example, such that a received updating parameter may represent connection weights for only select layers of the deep neural network.

Figure 4:
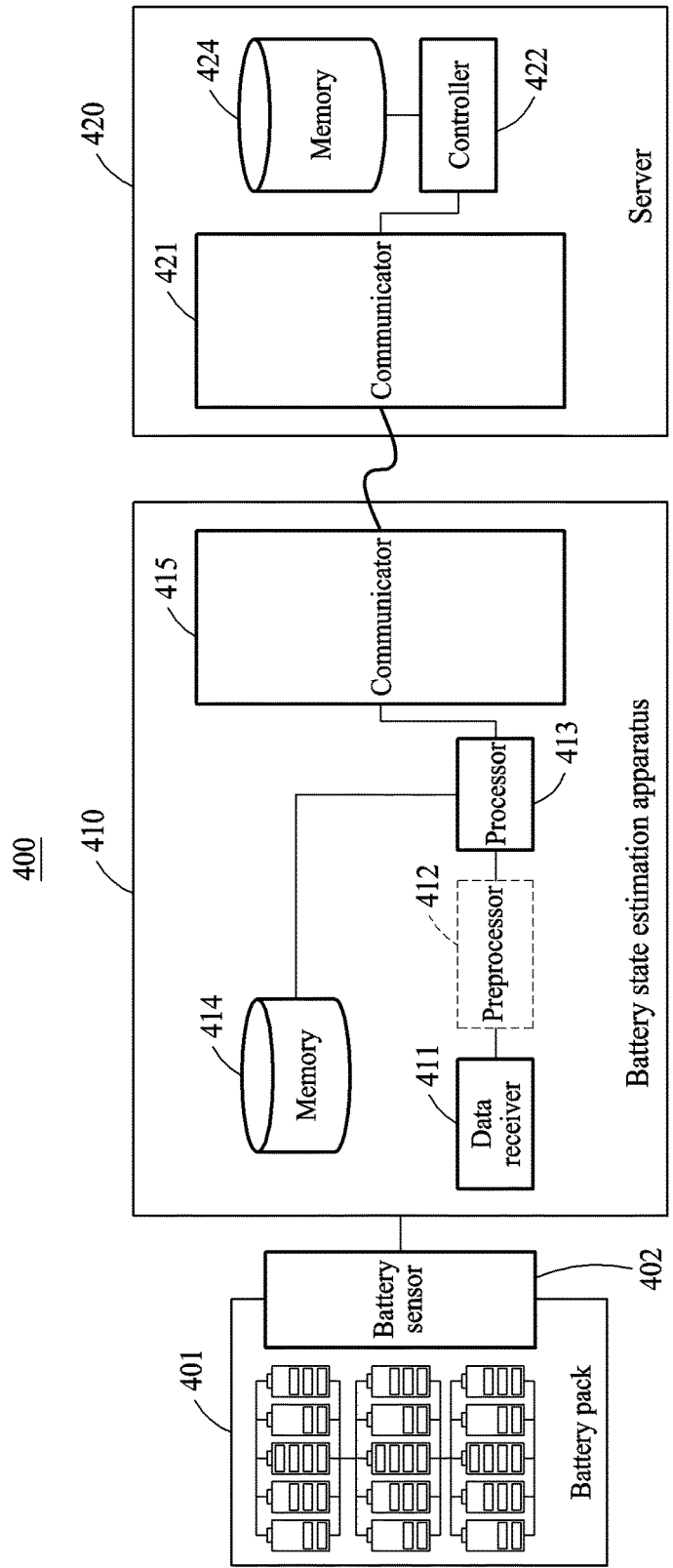
FIG. 4 is a block diagram illustrating an example of a configuration of a battery state estimation system in accordance with one or more embodiments.

FIG. 4 is a block diagram illustrating an example of a configuration of a battery state estimation system in accordance with one or more embodiments.

Referring to FIG. 4, a battery state estimation system 400 includes a battery pack 401, a battery state estimation apparatus 410, and a battery state estimation server 420, for example.

The battery pack 401 includes a plurality of batteries. At least a portion of the batteries are connected in parallel or series. For example, as shown in FIG. 4, at least a portion of the batteries are connected in parallel to form a battery module, and battery modules are connected in series. In FIG. 4, five batteries are connected in parallel, and three batteries are connected in series. However, the configuration of the battery pack 401 is not limited thereto, and may vary depending on embodiment.

The battery pack 401 includes a battery sensor 402. In another example, the battery sensor 402 is attached or connected to the battery pack 401. The battery sensor 402 generates battery information by measuring a voltage signal, a current signal, and a temperature signal of the battery pack 401. The battery sensor 402 transfers the generated battery information to the battery state estimation apparatus 410. Hereinafter, a battery refers to the battery pack 401.

The battery state estimation apparatus 410 is a device configured to estimate state information of a battery from the battery information received from the battery sensor 402. The battery state estimation apparatus 410 includes a data receiver 411, a preprocessor 412, a processor 413, a memory 414, and a communicator 415, for example.

The data receiver 411 receives battery information. For example, the battery receiver 411 receives the battery information measured by the battery sensor 402 from a battery through a data interface.

The preprocessor 412 preprocesses the received battery information. For example, the preprocessor 412 changes the battery information to a form suitable for estimating the state information, for example, by amplifying the battery information or removing noise.

The processor 413 estimates state information of the battery from the battery information based on a battery model. The processor 413 determines whether a new parameter is needed by monitoring the state information of the battery continuously. Here, the processor 413 estimates the state information of the battery periodically or non-periodically. In response to a determination that a new parameter is needed, the processor 413 requests and receives the new parameter from the external battery state estimation server 420 through the communicator 415. Further, the processor 413 stores the new parameter in the memory 414, and updates the battery model using the new parameter. An operation of the processor 413 will be described in greater detail further below.

The memory 414 stores the battery model and/or a corresponding parameter defining a specialized structure, for example, an ML structure, of the battery model. In an example, the memory 414 may store and manage different parameters for each version, with respect to a single ML battery model structure or framework, where each parameter differently configures the same ML battery model structure, though embodiments are not limited thereto. For example, where the ML battery model structure is a neural network, a same neural network structure or framework may be defined by same hyper-parameters that define the configurations of the layers and nodes and corresponding activation functions, while different parameters, defining particular connection weightings, applied to the same neural network structure may result in substantially different specialized neural networks.

The communicator 415 transmits an update request to the battery state estimation server 420, and receives a parameter corresponding to the update request from the battery state estimation server 420. The communicator 415 receives the parameter from the battery state estimation server 420 periodically or using a push.

The battery state estimation server 420 includes a communicator 421, a controller 422, and a memory 424, for example. Here, though one battery state estimation server is illustrated, the battery state estimation server 420 may represent multiple battery state estimation servers 420. Likewise, though one battery state estimation apparatus is illustrated, the battery state estimation apparatus 410 may represent multiple battery state estimation apparatuses 410. In addition, one of such battery state estimation apparatuses 410 may be included in one of the battery state estimation servers 420, and one of such battery state estimation servers 420 may be included in one of the battery state estimation apparatuses 410.

The communicator 421 receives the update request from the battery state estimation apparatus 410. The communicator 421 transmits the parameter corresponding to the update request to the battery state estimation apparatus 410. Further, the communicator 421 may receive reference data from an external device.

The controller 422 controls the communicator 421 to transmit the parameter corresponding to the update request to the battery state estimation apparatus 410. The controller 422 searches the memory 424 for the parameter corresponding to the received update request. In response to the parameter stored in the memory 424 being found, the controller 422 transmits the found parameter to the battery state estimation apparatus 410 through the communicator 421.

The controller 422 generates a battery model based on reference data, such as reference data of a battery included in or externally connected to the battery state estimation server 420. For example, the controller 422 trains the battery model based on the reference data collected until a predetermined point in time, thereby generating a parameter with respect to the battery model. The controller 422 stores at least one of the battery model and/or the parameter trained with respect to the battery model in the memory 424. In response to new reference data being received, the controller 422 generates a battery model and a parameter trained based on the new reference data. However, embodiments are not limited thereto. The controller 422 may wait until a predetermined amount of reference data is collected. In response to the amount of the collected reference data exceeding a predetermined threshold amount of data, the controller 422 trains the battery model and the parameter. Further, the controller 422 may train the battery model and the parameter based on the reference data at a predetermined interval.

The controller 422 may determine or identify a version of the battery model and the parameter based on, or through, the point in time at which the reference data is collected, and may manage the battery model and the parameter by version. For example, a battery model and a parameter trained based on reference data collected until a point in time a1 may be managed as a version A1, and a battery model and a parameter trained based on reference data collected until a point in time a2 may be managed as a version A2. Here, a1 and a2 denote different points in time, and A1 and A2 denote information indicating different versions.

The memory 424 stores the battery model. For example, the memory 424 stores the battery model and the parameter corresponding to the battery model. In one or more embodiments, the battery state estimation apparatus may be considered as further including the battery pack 401 and the battery sensor 402. In addition, the battery state estimation apparatus may further include a user interface, such as when the battery state estimation apparatus is a vehicle or drone and the user interface includes the dashboard, center console, and/or steering instrument devices/elements.

Figure 5:
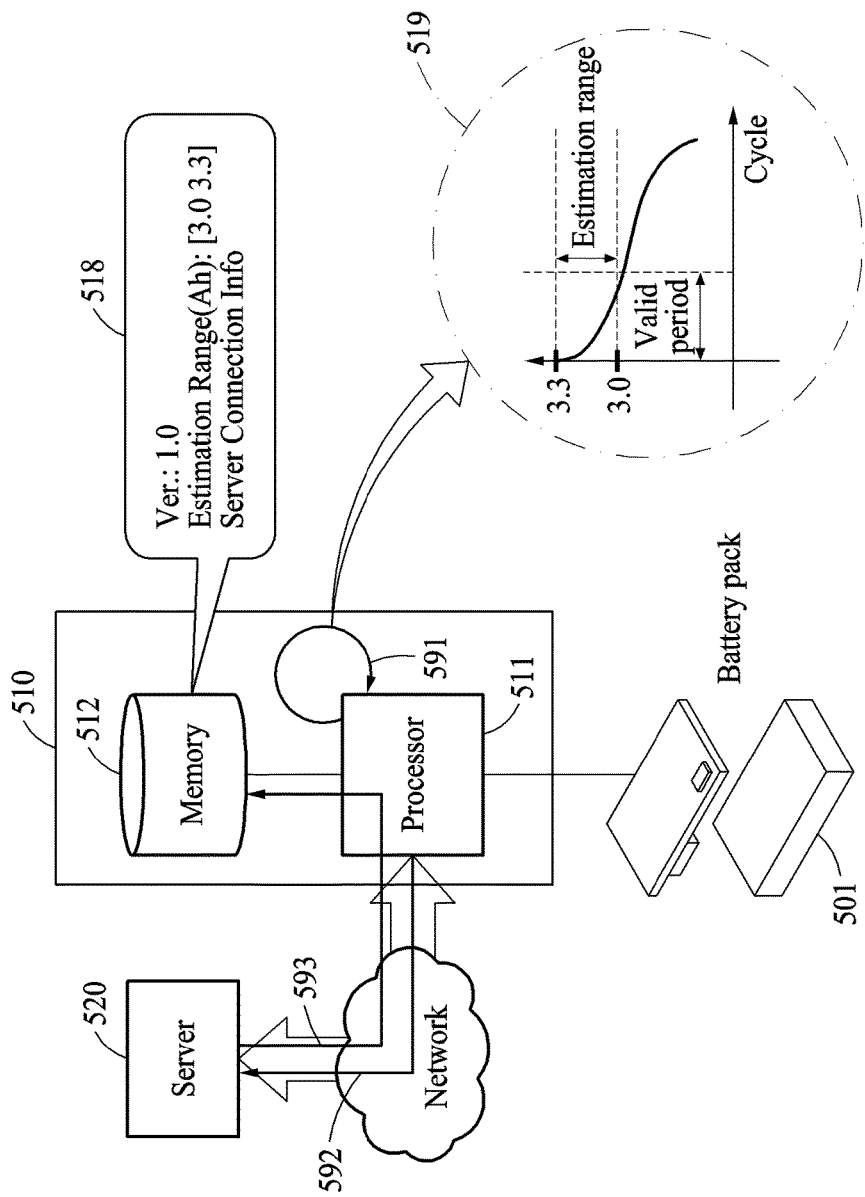
FIG. 5 is a diagram illustrating an example of a battery state estimation process in accordance with one or more embodiments.

FIG. 5 is a diagram illustrating an example of a battery state estimation process in accordance with one or more embodiments.

Referring to FIG. 5, a processor 511 receives battery information from a battery pack 501 in real time. In operation 591, the processor 511 estimates state information of a battery from the battery information using a battery model. The processor 511 determines whether the estimated state information is outside of an estimation range of the battery model. In response to the estimated state information being within the estimation range, the processor 511 determines that the battery model is valid. While the battery model is determined valid, the processor 511 repeats operation 591 of estimating the state information of the battery in real time or periodically. In addition, when the processor 511 determines the battery model is valid, the processor 511 may use the estimated state of the battery pack 501 as a final battery state estimation of the battery pack 501.

Here, the memory 512 may store the battery model and metadata 518 related to the battery model. The metadata 518 may include version information indicating a battery model and a current training level of the battery model, an estimation range of a currently selected battery model and corresponding parameter, and server connection information. As only an example, the server connection information may include an Internet address, for example, a uniform resource locator (URL), of the battery state estimation server 520 having a more recent parameter with respect to the currently selected battery model or with respect to the current estimation range, for example.

In response to the estimated state information being determined to be outside of the estimation range, the processor 511 determines that the battery model is invalid. As shown in a battery life graph 519 of FIG. 5, the estimation range of the currently selected battery model and the parameter corresponds to a maximum capacity of a battery which ranges from 3.0 ampere hour (Ah) to 3.3 Ah. A period corresponding to the estimation range is a period in which state estimation performed based on the currently selected battery model and parameter is valid. Here, the period is represented in a unit of charge and discharge cycle of the battery, and a single charge and discharge cycle is a single cycle in which the battery is fully charged and fully discharged. In response to the state information estimated by the processor 511 being outside of the estimation range, the state estimation performed based on the currently selected battery model and the parameter is determined invalid in a subsequent cycle.

In response to the determination that the currently selected battery model and the parameter in the memory 512 are invalid, the processor 511 transmits an update request to the battery state estimation server 520, in operation 592, such as through the illustrated network. In response to the update request being received, the battery state estimation server 520 transmits a parameter trained based on reference data collected until a point in time at which the update request is received and for an estimation range corresponding to the update request, for example, to a battery state estimation apparatus 510, in operation 593. Alternatively, the request may be accommodated by an intermediary server or cloud server that stores trained parameters and/or corresponding trained battery models uploaded from the battery state estimation server 520, such as updated routinely or upon completion of such parameters and/or battery models by the battery state estimation server 520. The battery state estimation apparatus 510 estimates valid state information of the battery within an estimation range changed or expanded by the updated parameter.

However, embodiments are not limited thereto. In response to a determination that the currently selected battery model and the parameter in the memory 512 are invalid, the processor 511 may alternatively search the memory 512 for a battery model and a parameter corresponding to the update request. In response to the battery model and the parameter corresponding to the update request being found in the memory 512, the processor 511 selects the found battery model and the found parameter, and performs state estimation by applying the parameter to the selected battery model. In response to the battery model and the parameter corresponding to the update request being not found, the processor 511 transmits an update request to the battery state estimation server 520, in operation 592. In addition, if a change in the battery is sensed, such as if the battery is changed or swapped for another or new battery, the searching of the memory and/or update requesting may also be performed.

Figure 6:
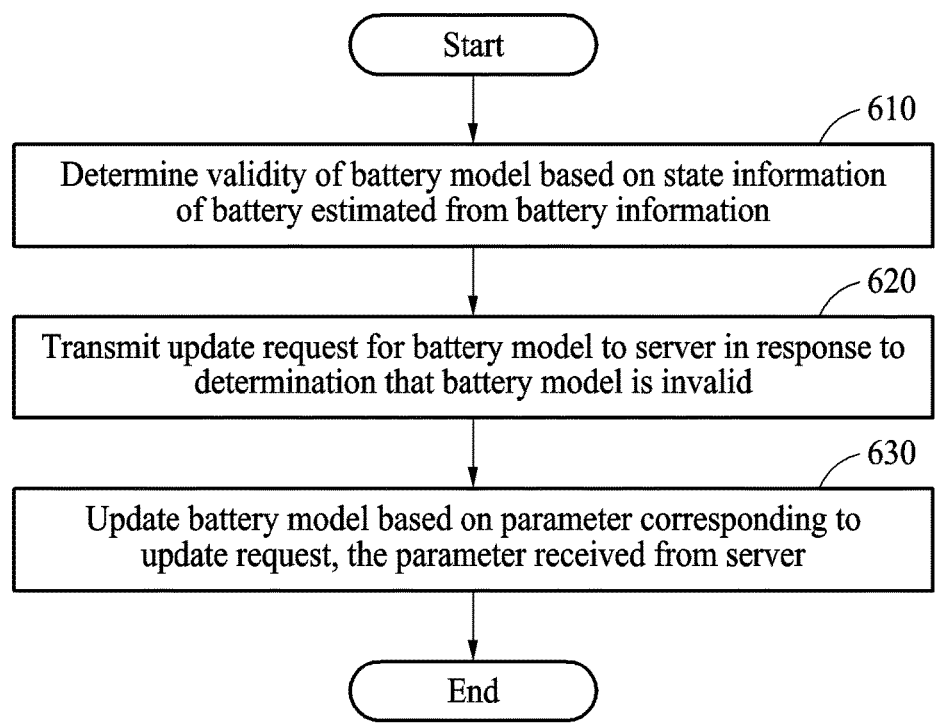
FIGS. 6 and 7 are flowchart illustrating examples of a battery state estimation method in accordance with one or more embodiments.
Figure 7:
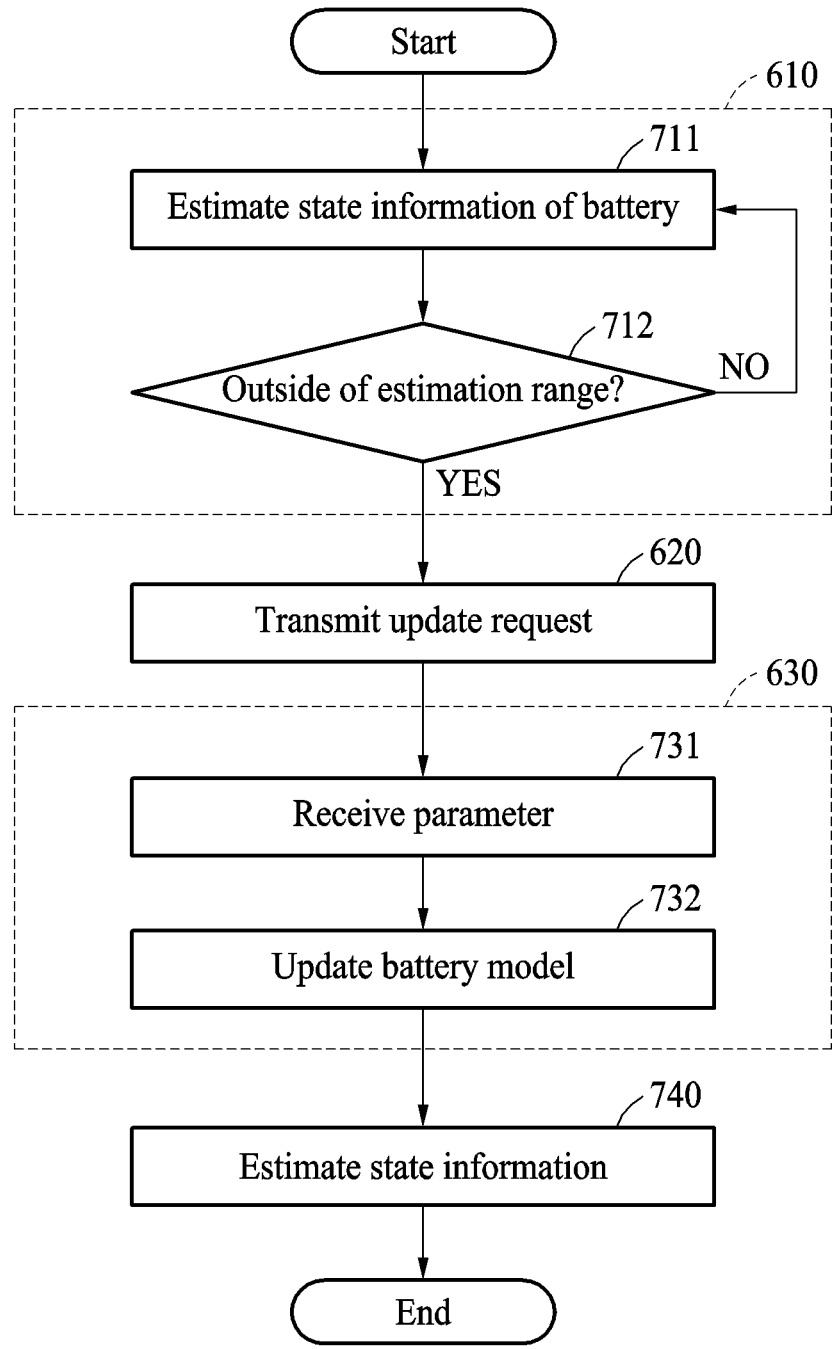

FIGS. 6 and 7 are flowchart illustrating examples of a battery state estimation method in accordance with one or more embodiments.

Referring to FIGS. 6 and 7, in operation 610, a processor of a battery state estimation apparatus determines a validity of a battery model based on state information of a battery estimated from battery information. In detail, in operation 711, the processor estimates the state information of the battery. In operation 712, the processor determines whether the estimated state information is outside of an estimation range for the current battery model. In response to a determination that the estimated state information is within the estimation range, the processor performs operation 711. For example, in response to a determination that the state information of the battery is valid, the processor continuously estimates the state information of the battery from the battery information based on the battery model and a parameter currently applied to the battery model.

In response to a determination that the estimated state information is outside of the estimation range of the battery model, the processor determines that the parameter applied to the battery model is invalid. For example, in response to the estimated state information being less than a minimum level of state information set to be estimable by the battery model, the processor determines that the estimated state information is outside of the estimation range.

In operation 620, in response to a determination that the battery model is invalid, the processor transmits an update request for the battery model to a battery state estimation server using a communicator. The processor transmits, to the battery state estimation server, a signal to request a parameter having a range overlapping at least a portion of an estimation range of a parameter applied to the battery model. In response to the estimated state information being less than or equal to a minimum level of the estimation range of the parameter applied to the battery model, the processor transmits, to the battery state estimation server, a signal to request a parameter trained to estimate state information less than or equal to the minimum level.

In operation 630, the processor updates the battery model based on a parameter corresponding to the update request, the parameter being received from the battery state estimation battery state estimation server. In detail, in operation 731, the processor receives the parameter corresponding to the update request through the communicator. The processor receives, from the battery state estimation server through the communicator, such a parameter having been trained to a minimum level estimable based on reference data collected for up to a point in time at which the update request is received, for example. In operation 732, the processor updates the battery model based on the received parameter. In a case in which the battery model is a neural network including a plurality of nodes, the processor updates a connection weight to connect nodes based on the received parameter. In addition, if the parameter includes connection weights and hyper-parameters defining the structure of the neural network, or such trained hyper-parameters are forwarded/received along with the parameter, the processor may update the structure and corresponding connection weights of the neural network. Alternatively, updates to the battery model may be based on a consistent structure, e.g., with the same hyper-parameters but different connection weights, for different trained estimation ranges.

In operation 740, the processor estimates state information of the battery based on the updated battery model. For example, the processor estimates the state information of the battery using the updated battery model until the state information estimated based on the update battery model is outside of the new estimation range in operation 712.

Figure 8:
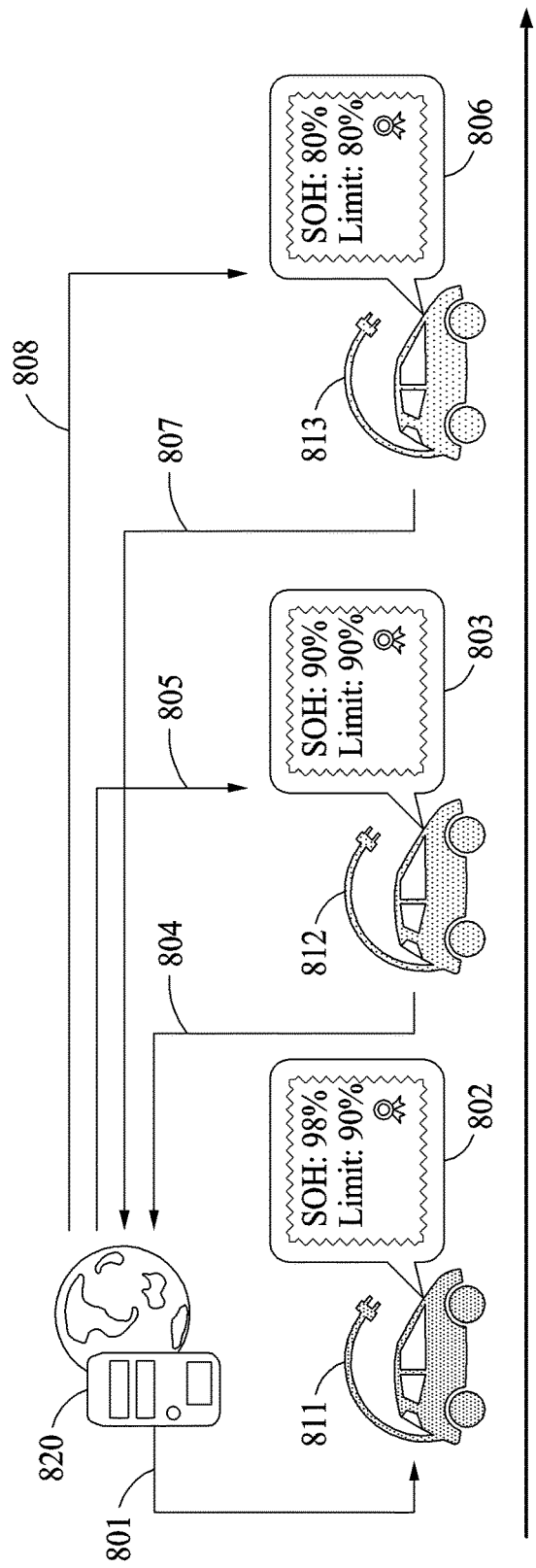
FIG. 8 illustrates an example of an operation of battery state estimation in accordance with one or more embodiments.

FIG. 8 illustrates an example of an operation of battery state estimation in accordance with one or more embodiments.

In FIG. 8, a case in which a battery state estimation apparatus is provided in an EV is described as an example. However, embodiments are not limited thereto. The battery state estimation apparatus may be applicable to, and embodiments correspondingly include, all electronic devices using a battery as a power source. A battery state estimation apparatus 811 of a first point in time, a battery state estimation apparatus 812 of a second point in time, and a battery state estimation apparatus 813 of a third point in time are the same battery state estimation apparatus. The battery state estimation apparatus 813 of the third point in time has an updated parameter, unlike the battery state estimation apparatus 811 of the first point in time and the battery state estimation apparatus 812 of the second point in time. The battery state estimation apparatus 811 of the first point in time and the battery state estimation apparatus 812 of the second point in time have the same parameters. Thus, operation 801 corresponds to the battery state estimation apparatus 811 of the first point in time having received such an initial battery model from a battery state estimation server 820. The parameter applied to the battery model of the battery state estimation apparatus 811 of the first point in time may sufficiently guarantee an accuracy of state information estimation only within a first estimation range. For example, FIG. 8 illustrates a case in which the first estimation range is a range of SoH from 100% to 90%. In operation 802, the battery state estimation apparatus 811 of the first point in time estimates state information of a battery at the first point in time. In response to the estimated state information, for example, an SoH of 98%, being greater than a minimum level, for example, 90%, and less than a maximum level (although not shown, assumed as 100%) of the first estimation range, the battery state estimation apparatus 811 determines the current battery model to be valid and estimates the state information of the battery using a currently selected battery model and parameter. The battery state information apparatus 811 may output the estimated battery state to a user, such as to a driver of a corresponding vehicle through a display of the vehicle or of the battery state estimation apparatus 811. For example, the displayed output may indicate the SoH, SoC, and/or residual available travel distance of the battery. The display output may also indicate whether the battery should be replaced, or an estimate of when the battery will need to be replaced, such as based on any of the SoH, SoC, and/or the residual available travel distance.

In operation 803, the battery state estimation apparatus 812 of the second point in time continuously estimates the state information of the battery from battery information using the battery model and the parameter having the first estimation range. It may be assumed that the state information estimated at the second point in time, for example, an SoH of 90%, is equal to the minimum level, for example, 90%, of the first estimation range. The battery state estimation apparatus 812 of the second point in time determines that a deterioration level of the corresponding battery has reached a limit of the first estimation range of the correspondingly currently selected battery model and parameter. In operation 804, the battery state estimation apparatus 812 of the second point in time transmits, to the battery state estimation server 820, a signal to request a parameter having an estimation range with respect to a level less than or equal to the minimum level of the first estimation range, for example, an update request.

In operation 805, the battery state estimation server 820 transmits a parameter corresponding to the update request to the battery state estimation apparatus 812 of the second point in time. The battery state estimation apparatus 812 of the second point in time updates its current battery model based on the received parameter. The received parameter has a second estimation range. The second estimation range is a range in which state information less than the minimum level of the first estimation range is estimable with sufficient predetermined accuracy. For example, a maximum level of the second estimation range may be 100%, and a minimum level of the second estimation range may be 80%. However, embodiments are not limited thereto. Alternatively, the second estimation range may have a range overlapping a portion of the first estimation range, and may be set to have, for example, a maximum level of 91% and a minimum level of 80%. The minimum level of the second estimation range is a minimum level estimable by a battery model and a parameter trained based on reference data collected by the battery state estimation server 820 until the second point in time.

In operation 806, the battery state estimation apparatus 813 of the third point in time continuously estimates the state information of the battery using its current battery model and parameter having the second estimation range. As shown in FIG. 8, in response to state information estimated at the third point in time, for example, an SoH of 80%, being equal to the minimum level, for example, 80%, of the second estimation range, the battery state estimation apparatus 813 of the third point in time may determine that the deterioration level of the battery reaches a limit of the second estimation range. In operation 807, the battery state estimation apparatus 813 of the third point in time transmits, to the battery state estimation server 820, a signal to request a parameter having an estimation range with respect to a level less than or equal to the minimum level of the second estimation range. In operation 808, the battery state estimation server 820 transmits a parameter having a third estimation range overlapping at least a portion of the second estimation range, in response to the update request.

The battery state estimation server 820 stores various battery models and various parameters corresponding to the battery models. The battery state estimation server 820 may transmit a parameter corresponding to an update request received from a battery state estimation apparatus. As only examples, the parameter received by the battery state estimation apparatus may be for use only for a portion of range of the state information or may be for use for the full range of the state information. For example, in an initial period in which a new battery is released, released from manufacture, or firstly used in a particular electronic device, the battery state estimation server 820 stores only a parameter to be used only for an initial range, for example, the first estimation range. For example, upon a sufficient time elapses after the release, a sufficient amount of reference data related to a deteriorated battery being monitored by the battery state estimation server 820 is collected, and the battery state estimation server 820 and the battery state estimation apparatus respectively generate and maintain a single battery model and a single parameter based on the collected reference data.

Figure 9:
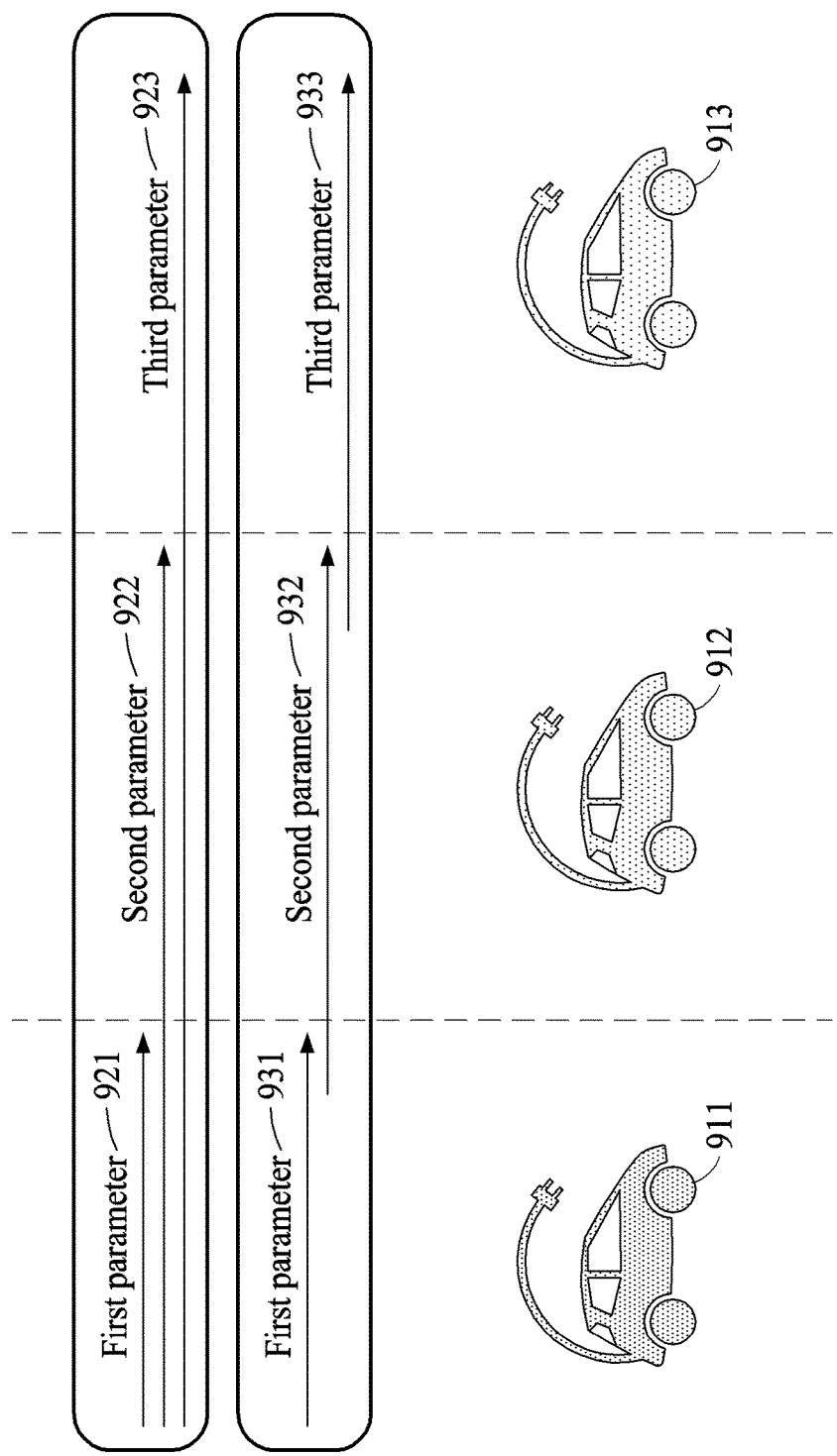
FIG. 9 illustrates an example of parameters applied to a battery model in accordance with one or more embodiments.

FIG. 9 illustrates an example of parameters applied to a battery model in accordance with one or more embodiments.

A change in capacity of a battery and a change in internal resistance of the battery with respect to battery deterioration show non-linear characteristics. For example, a newly developed battery may have unpredictable state information depending on component proportions of materials constituting an anode, a cathode, and electrolyte of the battery. In this example, a great amount of time is used to finish battery life experiments in a laboratory before a product is released.

In an initial period of product release, a battery state estimation server trains battery models and generates corresponding first parameters 921 and 931 based on reference data of a fresh battery. The first parameters 921 and 931 may guarantee sufficiently high accuracies to predetermined accuracy or confidence levels in a state information range of an initial period 911, for example, a predetermined battery capacity and internal resistance period. However, in response to a deterioration level of the battery being out of the initial period 911 as the battery is used over time, there may be a great error between state information estimated based on the parameters trained based on the initial reference data and an actual state of the battery.

The battery state estimation server may additionally collect the reference data by continuously conducting an experiment in a laboratory after the battery is released, for example, or by obtaining a profile corresponding to driving of an actual EV. The battery state estimation server trains battery models based on the additionally collected reference data and generates corresponding second parameters 922 and 932 for estimating the state information of the deteriorated battery in a middle period 912 after the initial period 911. Further, the battery state estimation server trains battery models and generates corresponding third parameters 923 and 933 for estimating the state information of the deteriorated battery in a final period 913 after the middle period 912. The battery state estimation server transmits at least one of the generated parameters, e.g., between first parameters 921 through 933, in response to an update request from a battery state estimation apparatus.

For example, the battery state estimation server may sequentially train the battery models so that a second estimation range corresponding to the second parameter 922 includes an entire first estimation range corresponding to the first parameter 921, and a third estimation range corresponding to the third parameter 923 includes the entire second estimation range corresponding to the second parameter 922. In this example, the battery state estimation server obtains respective battery models and parameters to estimate state information with respect to the entire range trained thus far.

Alternatively, or in addition, the battery state estimation server may sequentially train the battery models such that the second estimation range corresponding to the second parameter 922 includes only a portion of the first estimation range corresponding to the first parameter 921 and the third estimation range corresponding to the third parameter 923 includes only a portion of the second estimation range corresponding to the second parameter 922. In this example, the battery state estimation server obtains respective local battery models and parameters to guarantee sufficiently optimal state estimation to predetermined accuracy or confidence levels for each predetermined range of the deterioration level of the battery.

Figure 10A:
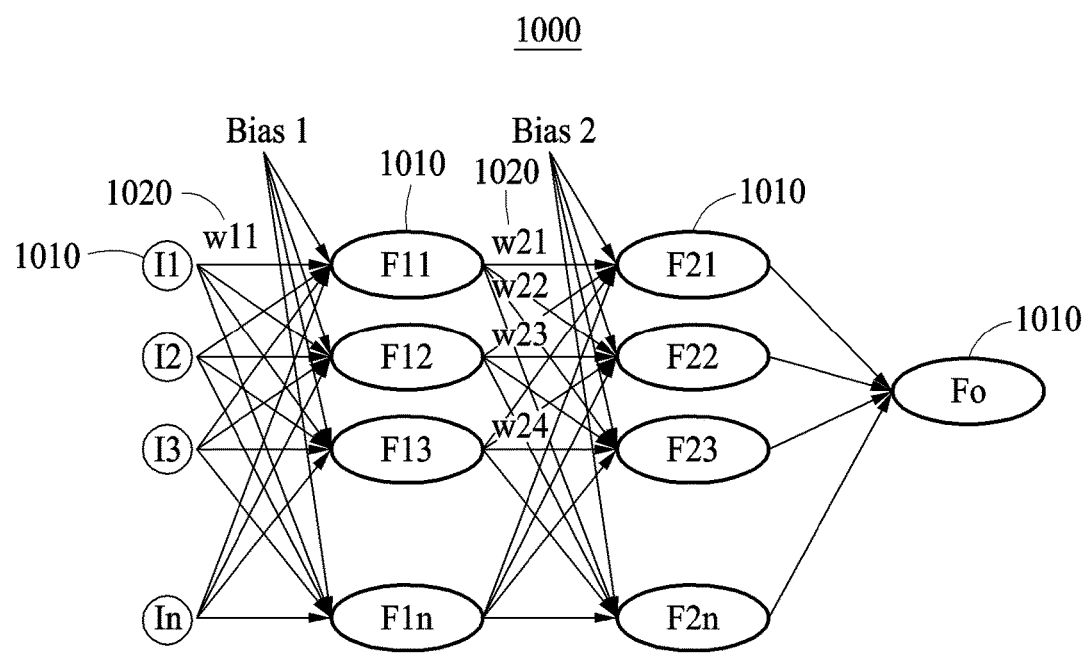

FIGS. 10A and 10B respectively illustrate an example of a battery model and parameters applied to the battery model in accordance with one or more embodiments.

A battery model may be a neural network 1000. The neural network 1000 is implemented by hardware, such as solely through hardware, solely through processor executed instructions stored on a non-transitory computer readable medium, or a combination thereof. The neural network 100 may also be referred to as an artificial neural network. The neural network 100 uses artificial neurons or nodes that are configured differently than biological neurons by being connected to each other through edges having connection weights. The connection weights are predetermined values of the edges, e.g., set during training, and may also be referred to as synapse weights or connection strengths.

The neural network 1000 includes a plurality of layers. For example, the neural network 1000 includes an input layer, plural hidden layers, and an output layer. The input layer receives input feature data and transmits respective inputs to the illustrated first hidden layer based on respective weightings, at which time the nodes of a hidden layer respectively implement activation functions. Likewise, outputs of a previous hidden layer may be weighted and provided to respective nodes of a final hidden layer, which implement their activation functions, and respective outputs of the final hidden layer are input to one or more nodes of the output layer and the output layer generates an output of the neural network 1000. Here, the outputs of the final hidden layer may also be respectively weighted before being acted on by the one or more nodes of the output layer. The hidden layer is disposed between the input layer and the output layer.

For example, during training, a hidden layer may operate on a training input of training data received from the input layer to output an expected or easily predictable value through the output layer. Herein, the training data may be a data set including a plurality of training pairs. For example, a training pair includes a training input and a training output, and the training output may be a value to be output from the training input paired with the training output. Thus, the training data includes a plurality of training inputs, and training outputs mapped to the plurality of training inputs, respectively. When the input and output pair are known, the corresponding training may be called supervised training, while when the output is not known or the input is not labeled, the training may be called unsupervised training.

During training of the neural network 1000, training data of reference data is input, and through iterative operations the respective weightings between each of the layers may be each adjusted until the neural network 1000 is trained. For example, the nodes of the hidden layers may change the training input of reference data received from the input layer to output through the output layer an expected or known value. The eventual configuration and weightings of the trained neural network 1000 may be stored, and thus represent a parameter that will generate or configure, when the parameter is applied, the neural network 1000 so as to specially process input received battery information measured from a battery, and output state information estimated from the battery information. For example, for the training, the battery state estimation server may determine respective connection weights for the weightings between the nodes through a gradient descent scheme which is based on a loss to be back-propagated to the neural network and output values of the nodes included in the neural network. For example, the battery state estimation server may update the connection weights among the nodes through loss back-propagation learning. Loss back-propagation learning refers to a method of estimating a loss with respect to provided training data through forward computation, and updating connection weights to reduce the loss while propagating the estimated loss in a backward direction from an output layer toward hidden layer(s) and an input layer. When the battery state estimation apparatus uses the neural network to perform battery state estimation, operations of the neural network are performed in an order of the input layer, the hidden layer(s), and the output layer. However, in the loss back-propagation learning, the connection weights are updated in an order of the output layer, the hidden layer(s), and the input layer. When training the neural network as desired, one or more processors of the battery state estimation server may use a local buffer memory configured to store layers or a series of computed data, for example.

As illustrated in FIG. 10A, the neural network 1000 receives battery information 11 through In through the input layer, n being an integer greater than or equal to "1". The nodes of the hidden layers are respectively connected with connection weights wij 1020, i and j being integers greater than or equal to "1". The nodes of the hidden layers each include respective non-linear functions Fxy as respective activation functions, for example, a Sigmoid function, a tan h function, a softmax function, or any of the functions Fxy may be a linear function, and where x and y are integers greater than or equal to "1". The example node of the output layer also similarly includes an activation function Fo. As only an example, in neural network 1000, the activation functions F11 through F1n of the nodes 1010 of the illustrated first hidden layer and the activation functions F21 through F2n of the nodes 1010 of the illustrated second hidden layer may be the Sigmoid or tan h functions, e.g., depending on normalization applied to input data, and an activation function Fo of the node 1010 of the output layer may be the softmax function. Here, the output layer Fo outputs state information, such as in a percentile or probabilistic format. Further, the neural network 1000 may also include one or more respective biases, such as the illustrated one or more illustrated bias 1's that may be applied to, or acted on by, a corresponding node 1010 of the first hidden layer along with the respective results of the weighted inputs, and the illustrated bias 2's that may be applied to, or acted on by, a corresponding node 1010 of the second hidden layer along with the respective results of weighted outputs of the nodes 1010 of the first hidden layer. The respective biases may be weighted or may not be weighted, depending on embodiment. In addition, the neural network 100 may further include contextual nodes and/or recurrent nodes or layers, for example.

A battery state estimation server manages parameters classified into separate versions for different estimation ranges, for example, as a database 1030 for a battery model of a predetermined structure. Here, a parameter or collection of parameters may each represent a different specially trained neural network. For example, referring to FIG. 10B, the battery state estimation server stores parameters for one or more neuro network model configurations for the estimation range from 97% to 100% as a version 2.0, and parameters for one or more neuro network model configurations for the estimation range from 90% to 98% as a version 2.1. A battery state estimation apparatus requests at least one of the plurality of parameters for the different estimation ranges stored in the battery state estimation server, based on state information computed based on a currently selected battery model and current corresponding parameter. Here, each battery model and corresponding parameter may be trained for guaranteeing a predetermined accuracy of estimation within a corresponding estimation range, though embodiments are not limited thereto.

Figure 11:
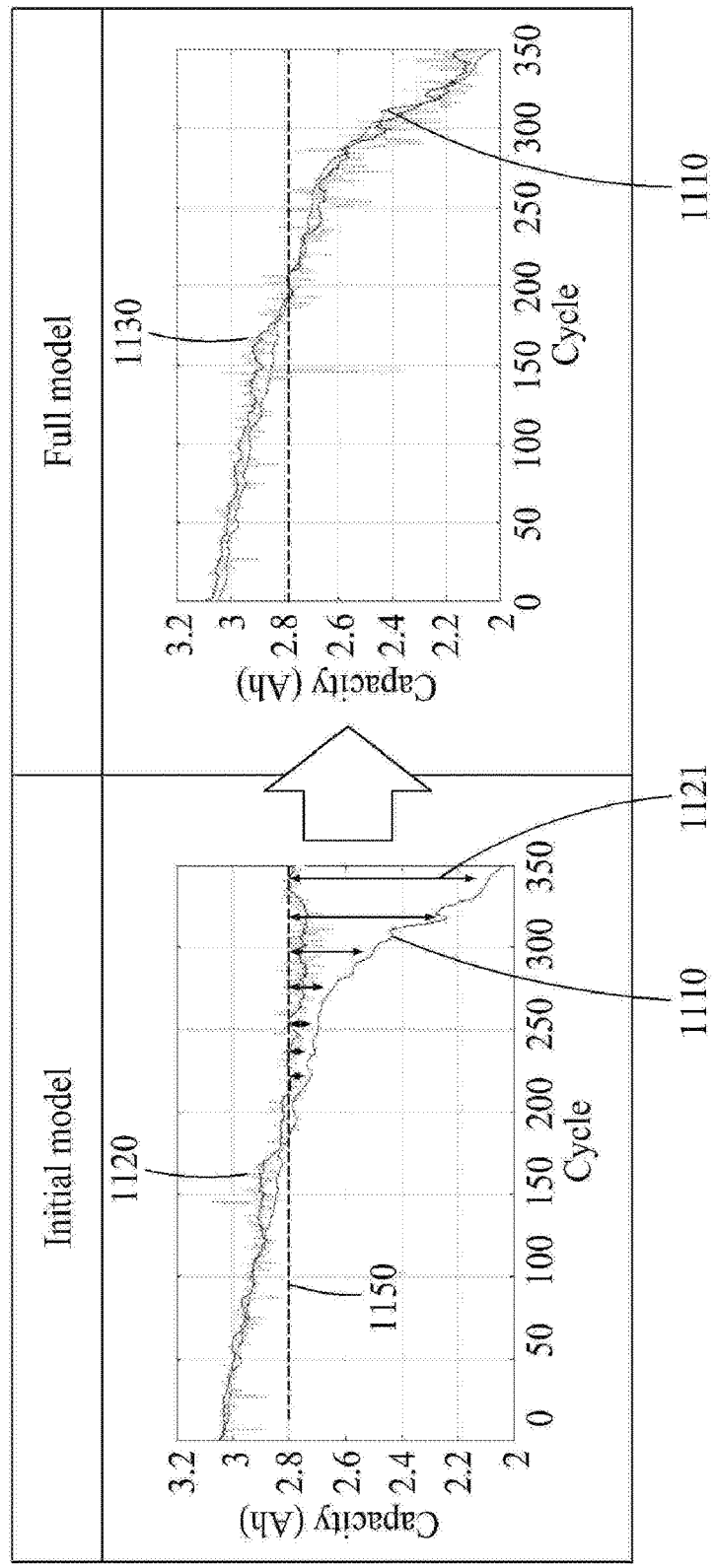
FIG. 11 illustrates example estimation comparisons between an initial battery model and a full or global battery model in accordance with one or more embodiments.

FIG. 11 illustrates example estimation comparisons between in an initial battery model and a full or global battery model in accordance with one or more embodiments.

The illustrated initial battery model is a battery model trained based on reference data collected until an initial period of release of the corresponding battery, corresponding battery state estimation apparatus, or corresponding electronic device. With a corresponding parameter defining the initial battery model, the initial battery model has an initial estimation range 1150, such as between 3.2 Ah and 2.8 Ah. The initial battery model provides a high accuracy of estimation with respect to state information of a corresponding battery within the initial estimation range 1150. However, when the state information is outside of the initial estimation range 1150, e.g., below 2.8 Ah, as the cycle of the battery increases an error 1121 also increases with deterioration of the battery. The error 1121 is a difference between actual state information 1110, for example, an actual life, and state information 1120 estimated based on the initial model, for example, an estimated life.

When a sufficient time elapses after the release, a battery state estimation server generates a full or global battery model which is a battery model trained based on fully collected reference data. A parameter applied to the full or global battery model provides a high accuracy within the corresponding full estimation range. Thus, as shown in FIG. 11, an error between state information 1130 estimated based on the full model and actual state information 1110 is not great.

However, in one or more embodiments, by selectively using different battery models that respectively cover different or overlapping estimation ranges that are less than the full estimation range, the error 1121 of the initial battery model can be avoided and a full reference data of the battery is not necessary before an accurate battery state can be estimated.

The batteries, battery packs, battery sensors, battery sensor systems, battery state estimation apparatuses, battery state estimation servers, battery state estimation systems, battery state estimation apparatus 220, battery state estimation server 210, battery state estimation system 200, battery state estimation apparatus 300, communicator 310, processor 320, memory 330, battery state estimation apparatus 410, battery state estimation server 420, battery state estimation system 400, battery pack 401, battery sensor 402, data receiver 411, preprocessor 412, processor 413, memory 414, communicator 415, communicator 421, memory 424, controller 422, battery state estimation apparatus 510, battery state estimation server 520, memory 512, processor 511, battery pack 501, battery state estimation apparatus 811, battery state estimation apparatus 812, battery state estimation apparatus 813, battery state estimation server 820, neural network, neural network 1000, database 1030, and battery models, as only examples, of FIGS. 1-11 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-11 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method to estimate a state of a battery, the method comprising:
    determining, by a processor, a validity of a battery model configured by a parameter, based on state information of the battery;
    controlling, by the processor, a communicator to transmit an update request for the battery model to an external battery model provider, in response to a result of the determining indicating that the battery model is invalid;
    receiving, by the processor, another parameter, in response to the update request; and
    updating, by the processor, the battery model to be configured by the other parameter.

2. The method of claim 1, further comprising:
    estimating, by the processor, the state information of the battery using the updated battery model and battery information.

3. The method of claim 1, wherein the determining comprises:
    estimating the state information of the battery from battery information using the battery model;
    determining whether the estimated state information of the battery is outside of an estimation range of the battery model;
    determining that the battery model is valid in response to the estimated state information of the battery being within the estimation range; and
    determining that the battery model is invalid in response to the estimated state information being outside of the estimation range.

4. The method of claim 3, wherein the determining of whether the estimated state information of the battery is outside of the estimation range comprises determining that the estimated state information of the battery is outside of the estimation range in response to the estimated state information of the battery being less than a predetermined minimum level of state information set to be accurately estimated by the battery model.

5. The method of claim 1, wherein the transmitting comprises transmitting, to a battery state estimation server that generates battery state models based on different parameters, a signal to request at least one parameter having a range overlapping at least a portion of an estimation range of the parameter that the battery model is dependent on.

6. The method of claim 1, wherein the determining comprises determining that the parameter that the battery model is dependent on is invalid in response to the estimated state information of the battery being outside of an estimation range of the battery model, and
    the transmitting comprises transmitting, to a battery state estimation server that generates battery state models based on different parameters, a signal to request at least one parameter trained to estimate state information less than or equal to a predetermined minimum level of the estimation range of the parameter that the battery model is dependent on in response to the estimated state information of the battery being less than or equal to the predetermined minimum level.

7. The method of claim 6, wherein the receiving further comprises receiving, from the battery state estimation server, one or more parameters trained to a different predetermined minimum level, of a different estimation range predetermined for accurate estimation, based on all or a select portion of reference data collected by the battery state estimation server up to a point in time at which the update request is received.

8. The method of claim 1, further comprising:
    searching, by the processor, for a parameter corresponding to a sensed change in the battery, from among parameters stored in a memory;
    updating, by the processor, when the searched for parameter is found, the battery model based on the found parameter;
    performing, by the processor, when the searched for parameter is not found, the transmitting, the receiving of the other parameter, and the updating of the battery model based on the other parameter; and
    estimating, by the processor, state information of the battery with the sensed change based on the updated battery model.

9. The method of claim 1,
    wherein the determining further includes searching for a parameter corresponding to a changed battery, among parameters stored in a memory, in response to a change of the battery being sensed, and wherein the transmitting further includes transmitting a signal to request the parameter corresponding to the changed battery in response to the parameter corresponding to the changed battery being not found.

10. The method of claim 1, further comprising:

continuing, by the processor, an estimating of the state information of the battery for continued changes in battery information based on the parameter that the battery model is dependent on, until the result of the determining indicates that that the estimated state information is invalid.

11. The method of claim 1, wherein the battery model is a battery model neural network and the parameter is a representation of specially trained connection weights within the battery model neural network trained for estimating a battery state for a first state information estimation range, and wherein the updating of the battery model includes applying connection weights represented by the other parameter to a neural network structure to generate another specially trained battery model neural network trained for estimating a battery state for a different second state information estimation range, with the generated other specially trained battery model neural network being the updated battery model.

12. The method of claim 1, wherein the battery model is a battery model neural network and the parameter that the battery model is dependent on is a trained connection weighting matrix, and the other parameter is a different trained connection weighting matrix.

13. The method of claim 1, wherein the parameter and the other parameter are respectively trained parameters for different battery state estimation ranges.

14. A non-transitory computer-readable medium storing instructions, that when executed by the processor, cause the processor to perform the method of claim 1.

15. An apparatus to estimate a state of a battery, the apparatus comprising:

a communicator to communicate with an external battery model provider;

a memory to store a battery state estimation model that is dependent on a parameter; and a processor configured to determine a validity of the battery state estimation model based on state information of the battery that is estimated from battery information of the battery, control the communicator to transmit an update request for the battery state estimation model to the external battery model provider in response to a result of the determining indicating that the battery state estimation model is invalid, and update the battery state estimation model based on another parameter received in response to the update request.

16. The apparatus of claim 15, further comprising the battery.

17. The apparatus of claim 15, wherein the processor is configured to estimate the state information of the battery from the battery information using the battery state estimation model, determine whether the estimated state information of the battery is outside of an estimation range of the battery state estimation model, determine that the battery state estimation model is valid in response to the estimated state information of the battery being within the estimation range, and determine that the battery state estimation model is invalid in response to the estimated state information being outside of the estimation range.

18. The apparatus of claim 17, wherein the processor is configured to determine that the estimated state information of the battery is outside of the estimation range in response to the estimated state information of the battery being less than a predetermined minimum level of state information set to be accurately estimated by the battery state estimation model.

19. The apparatus of claim 15, wherein the processor is configured to control the communicator to transmit, to a battery state estimation server that generates battery state estimation models based on different parameters, a signal to request at least one parameter having a range overlapping at least a portion of an estimation range of the parameter that the battery state estimation model is dependent on.

20. The apparatus of claim 15, wherein the processor is configured to determine that the parameter that the battery state estimation model is dependent on is invalid in response to the estimated state information of the battery being outside of an estimation range of the battery state estimation model, and control the communicator to transmit, to a battery state estimation server that generates battery state estimation models based on different parameters, a signal to request at least one parameter trained to estimate state information less than or equal to a predetermined minimum level of the estimation range of the parameter that the battery state estimation model is dependent on in response to the estimated state information of the battery being less than or equal to the predetermined minimum level.

21. The apparatus of claim 15, wherein the parameter and the other parameter are respectively trained parameters for different battery state estimation ranges.

22. An apparatus to estimate a state of a battery, the apparatus comprising:

a processor configured to determine a validity of a battery state estimation model neural network, which is dependent on first trained connection weighting information, based on state information of a battery that is estimated from battery information of the battery, control a transmitting of an update request for the battery state estimation model neural network to an external battery model provider in response to the determining indicating that the battery state estimation model neural network is invalid, and update the battery state estimation model neural network based on second different trained connection weighting information received in response to the update request.

23. The apparatus of claim 22, wherein the first trained connection weighting information is trained connection weighting information for a battery state estimation range different from a battery state estimation range for which the second trained connection weighting information is trained.

24. The method of claim 1, further comprising storing, by a memory, the state information of the battery.

25. The method of claim 24, wherein the communicator is configured to communicate with the external battery model provider.

26. The method of claim 25, wherein the battery model is used to estimate the state information of the battery.

27. The method of claim 1, wherein the parameter represents a collection of connection weights between nodes of a neural network of the battery model.

28. The method of claim 1, wherein the battery model is a machine learning (ML) model including any one or any combination of any two or more of a neural network, a hidden Markov model, a Beyesian network, a support vector machine (SVM), a decision tree (DT), and a nearest neighbors algorithm (k-NN).

\* \* \* \* \*